United States Patent
Hotta et al.

(10) Patent No.: US 10,916,521 B2
(45) Date of Patent: Feb. 9, 2021

(54) ELECTRICAL CONNECTOR WITH AN ELASTIC BODY HAVING CARBON NANOTUBES AND METHOD FOR MANUFACTURING SAME

(71) Applicant: Shin-Etsu Polymer Co., Ltd., Tokyo (JP)

(72) Inventors: Shinji Hotta, Saitama (JP); Masatoshi Tsuchiya, Saitama (JP)

(73) Assignee: SHIN-ETSU POLYMER CO., LTD., Tokyo (JP)

( * ) Notice: Subject to any disclaimer, the term of this patent is extended or adjusted under 35 U.S.C. 154(b) by 0 days.

(21) Appl. No.: 16/490,382

(22) PCT Filed: Apr. 10, 2018

(86) PCT No.: PCT/JP2018/015032
§ 371 (c)(1),
(2) Date: Aug. 30, 2019

(87) PCT Pub. No.: WO2018/190330
PCT Pub. Date: Oct. 18, 2018

(65) Prior Publication Data
US 2020/0075532 A1 Mar. 5, 2020

(30) Foreign Application Priority Data
Apr. 11, 2017 (JP) ................. 2017-078405

(51) Int. Cl.
*H01L 23/00* (2006.01)
*H01R 13/03* (2006.01)
(Continued)

(52) U.S. Cl.
CPC ............ *H01L 24/72* (2013.01); *H01R 13/03* (2013.01); *H01R 13/24* (2013.01); *H01R 43/18* (2013.01);
(Continued)

(58) Field of Classification Search
CPC .......... H01L 21/76877; H01L 23/5387; H01L 24/72; H01R 13/24; H01R 12/00;
(Continued)

(56) References Cited

U.S. PATENT DOCUMENTS 5,049,085 A * 9/1991 Reylek ............... H01R 13/2414
439/591
7,244,127 B2 * 7/2007 Hasegawa .......... H01R 13/2414
439/591
(Continued)

FOREIGN PATENT DOCUMENTS

CN 1643736 A 7/2005
JP H3-285211 A 12/1991
(Continued)

OTHER PUBLICATIONS

International Search Report in PCT Application No. PCT/JP2018/015032, dated Jun. 19, 2018, 4pp.

*Primary Examiner* — Abdullah A Riyami
*Assistant Examiner* — Justin M Kratt
(74) *Attorney, Agent, or Firm* — Hauptman Ham, LLP

(57) ABSTRACT

Provided is an electric connector, which is to be arranged between a connection terminal of a first device and a connection terminal of a second device, and is configured to electrically connect the connection terminal of the first device and the connection terminal of the second device to each other, the electric connector including: an elastic body having a plurality of through holes each being opened on a first surface and a second surface; and one or more carbon nanotube yarns joined to each of the through holes.

6 Claims, 9 Drawing Sheets

(51) Int. Cl.
H01R 13/24 (2006.01)
H01R 43/18 (2006.01)
H01R 43/20 (2006.01)
H01L 23/538 (2006.01)
H01R 12/71 (2011.01)
H01R 12/73 (2011.01)
H01R 12/00 (2006.01)
H01R 12/59 (2011.01)
H01L 21/768 (2006.01)
H01R 39/24 (2006.01)

(52) U.S. Cl.
CPC ........ H01R 43/20 (2013.01); *H01L 21/76877* (2013.01); *H01L 23/5387* (2013.01); *H01R 12/00* (2013.01); *H01R 12/59* (2013.01); *H01R 12/714* (2013.01); *H01R 12/718* (2013.01); *H01R 12/73* (2013.01); *H01R 39/24* (2013.01)

(58) Field of Classification Search
CPC .... H01R 12/59; H01R 12/714; H01R 12/718; H01R 12/73; H01R 39/24; H01R 13/03; H01R 43/18; H01R 43/20; H01R 13/22; H05K 2201/0314; H05K 2201/10378; H05K 2201/026; H05K 3/325

USPC ................ 439/66, 86, 90, 91, 591
See application file for complete search history.

(56) References Cited

U.S. PATENT DOCUMENTS

| 7,264,482 B2* | 9/2007 | Hasegawa ............ H01R 43/007 439/66 |
| 2005/0233620 A1 | 10/2005 | Hasegawa |
| 2007/0281501 A1* | 12/2007 | Ju ...................... H01R 13/2435 439/66 |
| 2015/0306690 A1* | 10/2015 | Qian ...................... B23H 7/08 219/69.12 |

FOREIGN PATENT DOCUMENTS

| JP | H1022034 A | 1/1998 |
| JP | 2787032 B2 | 8/1998 |
| JP | 2003-17158 A | 1/2003 |
| JP | 2007-188841 A | 7/2007 |
| JP | 2012-204285 A | 10/2012 |
| JP | 2014-71962 A | 4/2014 |

* cited by examiner

ELECTRICAL CONNECTOR WITH AN ELASTIC BODY HAVING CARBON NANOTUBES AND METHOD FOR MANUFACTURING SAME

RELATED APPLICATIONS

The present application is a National Phase of international Application Number PCT/JP2018/015032, filed Apr. 10, 2018. This application claims priority from Japanese Patent Application No. 2017-078405, filed on Apr. 11, 2017, the contents of which are incorporated herein by reference in their entirety.

TECHNICAL FIELD

This disclosure relates to an electric connector and a method of manufacturing an electric connector.

BACKGROUND ART

When a surface mount type semiconductor package and a circuit board are inspected, or when the surface mount type semiconductor package and the circuit board are connected to each other, a pressure contact type connector is used. As such connector, for example, there has been known a pressure contact type connector (see, for example, Patent Literature 1), which is obtained by: laminating a plurality of sheets, in which a plurality of conductive wires (conductive members) are wired so as to be aligned with each other in the same direction with insulation kept therebetween, on one another so that the conductive wires are arranged in a certain direction; arraying, laminating, and integrating a plurality of obtained laminates in a stepped shape at a certain angle with the directions of the conductive wires being aligned with each other, to obtain a block body; causing the obtained block body to adhere to a substrate surface for slicing; and cutting the block body on two parallel surfaces traversing the conductive wires in parallel to the substrate surface.

CITATION LIST

Patent Literature

[PTL 1] JP 2787032 B2

SUMMARY OF INVENTION

Technical Problem

The pressure contact type connector described in Patent Literature 1 has a problem in that, at the time of connecting the pressure contact type connector to a connection terminal of a device, an excessive force is applied to the connection terminal from a conductive member of the pressure contact type connector, which causes damage to the connection terminal.

This disclosure has an object to provide an electric connector that enables stable connection without application of an excessive force to a connection terminal of a device to be connected to the electric connector from a conductive member of the electric connector, and a method of manufacturing the electric connector.

Solution to Problem

[1] An electric connector, which is to be arranged between a connection terminal of a first device and a connection terminal of a second device, and is configured to electrically connect the connection terminal of the first device and the connection terminal of the second device to each other, the electric connector including: an elastic body having a plurality of through holes each being opened on a first surface and a second surface; and one or more carbon nanotube yarns joined to each of the through holes.

[2] The electric connector according to [1], wherein each of the through holes is configured to penetrate through the elastic body obliquely to a thickness direction of the elastic body.

[3] The electric connector according to [1] or [2], wherein at least a part of each of the carbon nanotube yarns is configured to protrude from at least one of the first surface and the second surface of the elastic body.

[4] The electric connector according to any one of [1] to [3], further including a plated layer on a surface of each of the carbon nanotube yarns.

[5] The electric connector according to any one of [1] to [4], further including a protruding portion, in which the elastic body and the carbon nanotube yarns are configured to partially protrude in the thickness direction of the elastic body, on at least one of the first surface and the second surface of the elastic body.

[6] The electric connector according to [5], further including a sheet-shaped member made of a resin, which is laminated on a region having a thickness smaller than a thickness of the protruding portion, on at least one of the first surface and the second surface of the elastic body.

[7] A method of manufacturing an electric connector, including: arranging a plurality of carbon nanotube yarns on a first surface of a first resin layer formed of an elastic body at suitable intervals with the plurality of carbon nanotube yarns being aligned with each other in a longitudinal direction; forming a second resin layer formed of an elastic body on the first surface of the first resin layer, to thereby form a carbon nanotube yarn-containing sheet; laminating a plurality of carbon nanotube yarn-containing sheets on one another with the plurality of carbon nanotube yarns in each of the plurality of carbon nanotube yarn-containing sheets being aligned with each other in the longitudinal direction, to thereby form a laminate of the plurality of carbon nanotube yarn-containing sheets; and cutting the laminate in a perpendicular direction or an oblique direction with respect to the longitudinal direction of the plurality of carbon nanotube yarns, to thereby obtain an electric connector.

[8] The method of manufacturing an electric connector according to [7], further including causing at least a part of each of the plurality of carbon nanotube yarns in the electric connector to protrude from at least one of the first surface and the second surface of the electric connector.

[9] The method of manufacturing an electric connector according to [7] or [8], further including removing a part of the elastic body and a part of the plurality of carbon nanotube yarns in a thickness direction from at least one of the first surface and the second surface of the electric connector, to thereby form a protruding portion in which the elastic body and the plurality of carbon nanotube yarns partially protrude in the thickness direction of the electric connector.

[10] The method of manufacturing an electric connector according to [9], further including laminating a sheet-shaped member made of a resin on a region other than the protruding portion after forming the protruding portion.

Advantageous Effects of Invention

According to this disclosure, an electric connector that enables stable connection without application of an excessive force to a connection terminal of a device to be connected to the electric connector from a conductive member of the electric connector, and a method of manufacturing the electric connector can be provided.

BRIEF DESCRIPTION OF DRAWINGS

FIGS. 1A to 1C are each a view for illustrating a schematic configuration of an electric connector according to a first embodiment, in which FIG. 1A is a plan view, FIG. 1B is an enlarged view of a region a in FIG. 1A, and FIG. 1C is a sectional view taken along the line A-A of FIG. 1A.

DESCRIPTION OF EMBODIMENTS

Now, specific description is given with reference to the drawings, but the dimensions in the figures are different from actual dimensions for convenience of the description. In addition, in this description, a numerical value range of from a lower limit value to an upper limit value corresponds to a numerical value range of equal to or larger than a lower limit value and equal to or smaller than an upper limit value unless it is specified that the numerical value range has another meaning. In addition, in this description, the term "thickness" refers to a value obtained by observing a cross section to be measured through use of magnifying observation means such as a digital microscope, measuring thicknesses at five positions, and averaging the thicknesses.

In the following embodiments, specific description is given in order to make the spirit of this disclosure understood well, and the following embodiments do not limit this disclosure unless otherwise specified.

First Embodiment

[Electric Connector]

Figure 1A:
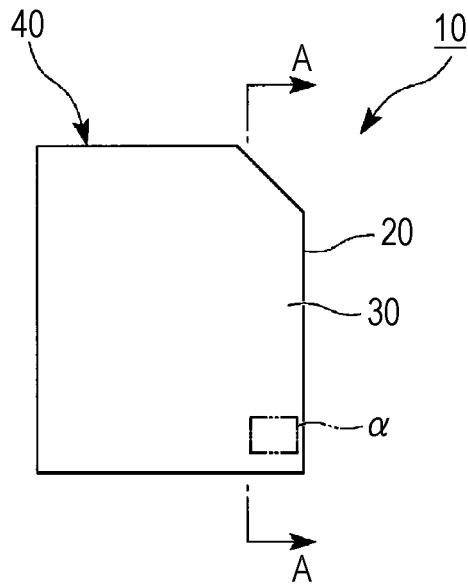
Figure 1B:
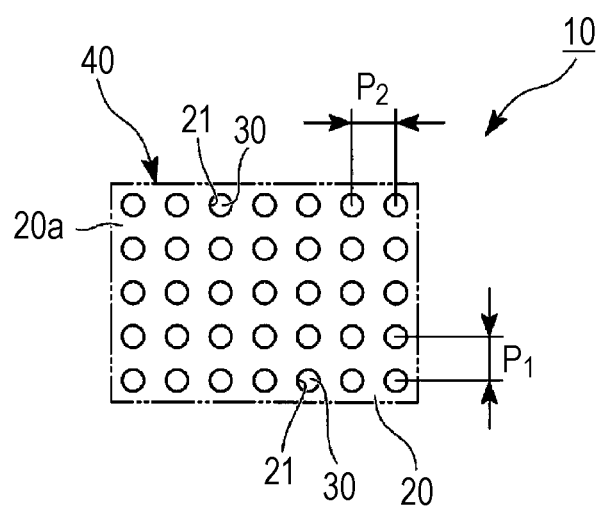
Figure 1C:
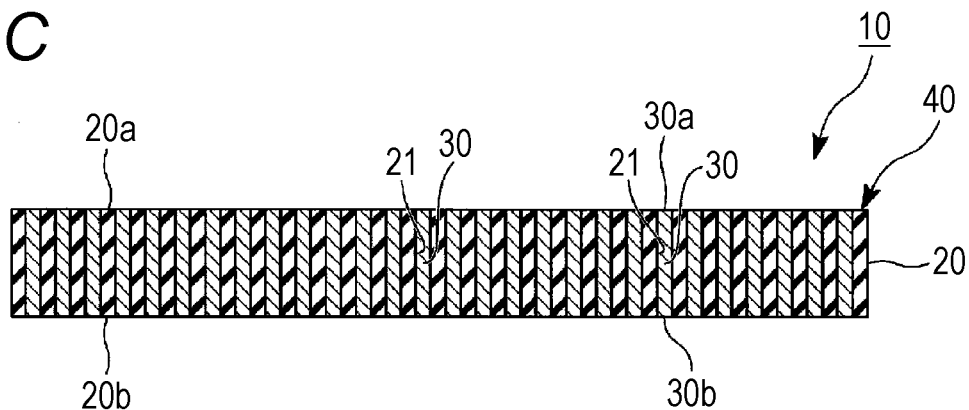

As illustrated in FIGS. 1A to 1C, an electric connector 10 according to this embodiment includes a composite 40 including an elastic body 20 and carbon nanotube yarns 30 (hereinafter simply referred to as "CNT yarns").

The electric connector 10 is to be arranged between a connection terminal of a first device (not shown) and a connection terminal of a second device (not shown), and is configured to electrically connect the connection terminal of the first device and the connection terminal of the second device to each other. In the electric connector 10, the CNT yarns 30 are conductive members configured to electrically connect the connection terminal of the first device and the connection terminal of the second device to each other. As the devices, there are given, for example, a semiconductor package and a circuit board.

The elastic body 20 has a large number of through holes 21 that penetrate through the elastic body 20 in a thickness direction thereof. The through holes 21 are opened on one principal surface 20a that is a first surface of the elastic body 20 and another principal surface 20b that is a second surface of the elastic body 20. One or more CNT yarns 30 are joined to an inner wall of each of the through holes 21.

The number of the CNT yarns 30 joined to the single through hole 21 can be set to, for example, from 1 to 10. From the viewpoint of reducing electric resistance in the single through hole 21 and obtaining flexibility, it is preferred that the number of the CNT yarns 30 be from 1 to 3, more preferably 1 or 2, still more preferably 1.

The positions at which the CNT yarns 30 are provided in the elastic body 20, that is, the arrangement of the through holes 21 in the elastic body 20 are not particularly limited, and are appropriately adjusted in accordance with the arrangement of the connection terminals of two devices to be electrically connected through the CNT yarns 30 joined to the through holes 21, and the like. In order to cause the electric connector 10 to be uniformly deformed (warped), it is preferred that the CNT yarns 30 and the through holes 21 be arranged at equal intervals in the elastic body 20.

The number of the CNT yarns 30 in the elastic body 20, that is, the number of the through holes 21 in the elastic body 20 is not particularly limited, and is appropriately adjusted in accordance with the arrangement of the connection terminals of the two devices to be electrically connected through the CNT yarns 30 joined to the through holes 21, the required pressing force of the CNT yarns 30 with respect to the connection terminal, and the like.

The through holes 21 penetrate through the elastic body 20 perpendicularly or obliquely to the thickness direction of the elastic body 20.

When the through holes 21 penetrate through the elastic body 20 obliquely to the thickness direction of the elastic body 20, it is preferred that the angle of each of the through holes 21 with respect to the thickness direction of the elastic body 20 be from 10° to 85°. It is preferred that the angle formed by the one principal surface 20a and each of the through holes 21 be from 15° to 80°, and that the angle formed by the another principal surface 20b and each of the through holes 21 be from 15° to 80°. The angle of each of the through holes 21 with respect to the thickness direction of the elastic body 20, the angle formed by the one principal surface 20a and each of the through holes 21, and the angle formed by the another principal surface 20b and each of the through holes 21 are appropriately adjusted in accordance with the arrangement of the connection terminals of the two devices to be electrically connected through the CNT yarns 30 joined to the through holes 21, and the like.

The alignment of each of the through holes 21 of the electric connector 10 may be the same or different.

The angle of each of the through holes 21 with respect to the thickness direction of the elastic body 20, the angle formed by the one principal surface 20a and each of the through holes 21, and the angle formed by the another principal surface 20b and each of the through holes 21 are measured based on an image obtained by observing a cross section of the elastic body 20 taken along the thickness direction thereof with magnifying observation means such as a digital microscope.

As the shape of the cross section of the through hole 21 perpendicular to a longitudinal direction, there are given, for example, a circular shape, an elliptic shape, a polygonal shape, and other indefinite shapes.

The hole diameter of each of the through holes 21 corresponds to a diameter of a minimum circle including a contour of the shape of the cross section of the through hole 21 perpendicular to the longitudinal direction, and is appropriately adjusted in accordance with the diameter (outer diameter) of each of the CNT yarns 30 joined to the through holes 21. It is preferred that the hole diameter of each of the through holes 21 be from 1 μm to 100 μm. The shape and hole diameter of each of the through holes 21 may be the same or different.

The shape and the hole diameter of each of the through holes 21 are measured based on an image obtained by observing the cross section with magnifying observation means such as a digital microscope.

The elastic body 20 is a sheet-shaped member, and as the size thereof, there is given, for example, 0.3 cm×0.3 cm to 50 cm×50 cm (length×width) in plan view.

It is preferred that the thickness of the elastic body 20 be from 0.03 mm to 1.0 mm. The thickness of the electric connector 10 is equal to the thickness of the elastic body 20.

The thickness of the elastic body 20 is a value obtained by measuring thicknesses at five positions in regions other than the protruding portions, and averaging the thicknesses.

The CNT yarns 30 are joined to each of the through holes 21 of the elastic body 20. The through holes 21 are each configured to hold the CNT yarns 30 with an elastic force originally owned by the elastic body 20. With this, the CNT yarns 30 are arranged so as to penetrate through the elastic body 20 perpendicularly or obliquely to the thickness direction of the elastic body 20. The alignment of the through holes 21 and the alignment of the CNT yarns 30 joined to the through holes 21 are matched with each other.

It is preferred that, under a state of being joined to the through hole 21, at least one of both end portions of each of the CNT yarns 30, that is, at least a part thereof protrude from at least one of the one principal surface 20a and the another principal surface 20b of the elastic body 20. It is more preferred that, under a state of being joined to the through hole 21, one end portion 30a of each of the CNT yarns 30 protrude from the one principal surface 20a of the elastic body 20, and another end portion 30b thereof protrude from the another principal surface 20b of the elastic body 20. When the end portion of each of the CNT yarns 30 does not protrude, it is preferred that, under a state of being joined to the through hole 21, an outermost surface (end surface) or a distal end of the one end portion 30a be at least in flush with the one principal surface 20a of the elastic body 20, and an outermost surface (end surface) or a distal end of the another end portion 30b be at least in flush with the another principal surface 20b of the elastic body 20.

The protrusion amounts (protrusion lengths) of the one end portion 30a and the another end portion 30b of the CNT yarn 30 from the elastic body 20 are not particularly limited, and are appropriately adjusted in accordance with the shapes and arrangement of the connection terminals of the two devices to be electrically connected by the electric connector 10, and the like. As the protrusion amount, there is given, for example, an amount of from about 0.01 mm to about 0.1 mm. The protrusion amount is measured based on an image obtained by observing the one principal surface 20a or the another principal surface 20b with magnifying observation means such as a digital microscope.

The interval between adjacent two through holes 21, that is, the center-to-center distance (pitch) between the adjacent two CNT yarns 30 is not particularly limited, and is appropriately adjusted in accordance with the arrangement of the connection terminals of the two devices to be electrically connected by the electric connector 10, and the like. It is preferred that the center-to-center distance ($P_1$ and $P_2$ in FIG. 1B) be from 4 μm to 200 μm. When there is one CNT yarn 30 joined to the single through hole 21, the center-to-center distance corresponds to a center-to-center distance between the adjacent two through holes 21. The center-to-center distance is measured based on an image obtained by observing the one principal surface 20a or the another principal surface 20b with magnifying observation means such as a digital microscope.

A material of the elastic body 20 is not particularly limited as long as the material has elasticity when formed into the elastic body 20. Examples of such material include synthetic rubbers, such as an acrylonitrile-butadiene rubber, a silicone rubber, a chloroprene rubber, an ethylene-chloroprene rubber, an ethylene-propylene-diene rubber, a styrene-butadiene rubber, a fluorine rubber, a butadiene rubber, an isoprene rubber, and a urethane rubber. Of those, a silicone rubber is preferred from the viewpoint that the silicone rubber has high elasticity and is excellent in heat resistance.

There is no particular limitation on the CNT yarn 30 as long as the CNT yarn 30 can electrically connect the connection terminals of the two devices to each other.

The CNT yarn 30 is a yarn obtained by twisting a carbon nanotube (CNT) having a tubular shape in which carbon atoms are connected to each other in a mesh shape.

The CNT forming the CNT yarn 30 may be a single-walled carbon nanotube (SWCNT) or a multi-walled carbon nanotube (MWNT).

The diameter (outer diameter) of the CNT yarn 30 is not particularly limited, but is preferably from 1 μm to 100 μm.

The twist number of the CNT yarn 30, that is, the number of CNTs forming the CNT yarn 30 is not particularly limited, but is preferably from 5 to 1,000,000.

The diameter (outer diameter) of the CNT forming the CNT yarn 30 is not particularly limited, but is preferably from 0.4 nm to 300 nm. The length of the CNT is not particularly limited, but is preferably from 50 μm to 1 mm.

The diameters and lengths of the CNT yarn and the CNT are measured based on an image obtained by observing the CNT yarn and the CNT through use of magnifying observation means such as an electron microscope or a digital microscope.

The single-walled carbon nanotube has high conductivity. Therefore, when the electric connector 10 is used for connecting devices for a high-frequency current, it is preferred that the CNT yarn 30 be formed of the single-walled carbon nanotube.

The CNT yarn 30 has a low resistance value because the CNTs forming the CNT yarn 30 are aligned in advance along a longitudinal direction.

As the features of the carbon nanotube, there are mainly given the following (1) to (6).

(1) The carbon nanotube is thin, lightweight, and strong.

(2) The carbon nanotube has a weight that is about a half of that of aluminum, a tensile strength that is 100 times that of iron steel, and a hardness that is about twice that of diamond.

(3) The carbon nanotube is not easily ruptured, and is excellent in restorability and rich in flexibility.

(4) The carbon nanotube has a current density resistance (property of withstanding a high-density charge amount in terms of a structure) as high as 1,000 times that of copper.

(5) The carbon nanotube can transfer heat in an amount of about 10 times that of copper, and has heat resistance of about 750° C. in air and about 2,300° C. in vacuum.

(6) The carbon nanotube is excellent in chemical resistance and is chemically stable. The carbon nanotube is insoluble in most chemicals without reacting therewith, and is insoluble also in hot sulfuric acid.

The electric connector 10 according to this embodiment includes the composite 40 including the elastic body 20 and the CNT yarns 30. The elastic body 20 has a large number of through holes 21 in the thickness direction. The CNT yarns 30 are joined to the through holes 21, and are configured to electrically connect the connection terminals of the two devices. Therefore, the composite 40 including the elastic body 20 and the CNT yarns 30 rich in flexibility are deformed (warped) in the thickness direction of the elastic body 20 with a smaller force. With this, when the connection terminal of the device to be connected to the electric connector 10 and the CNT yarns 30 are connected to each other, an excessive force is not applied from the CNT yarns 30 to the connection terminal of the device, and the connection terminal can be prevented from being damaged. In addition, in the electric connector 10 according to this embodiment, the CNT yarns 30 have heat resistance. Therefore, the connection terminals of the two devices can be electrically connected to each other stably through the CNT yarns 30 even in a high-temperature environment.

[Method of Manufacturing Electric Connector]

A method of manufacturing an electric connector according to this embodiment includes: a step (hereinafter referred to as "step A") of arranging a plurality of CNT yarns on a first surface of a first resin layer formed of an elastic body in parallel to each other at suitable intervals with the CNT yarns being aligned with each other in a longitudinal direction so that the longitudinal direction of each of the CNT yarns is parallel to the first surface of the first resin layer, forming a second resin layer formed of an elastic body on the first surface of the first resin layer, to thereby integrate the second resin layer with the first resin layer, and fixing the CNT yarns between the first resin layer and the second resin layer, to thereby form a CNT yarn-containing sheet; a step (hereinafter referred to as "step B") of laminating a plurality of CNT yarn-containing sheets on one another with the CNT yarns in each of the CNT yarn-containing sheets being aligned with each other in the longitudinal direction, to thereby form a laminate of the CNT yarn-containing sheets; and a step (hereinafter referred to as "step C") of cutting the laminate in a perpendicular direction or an oblique direction with respect to an extending direction (longitudinal direction) of the CNT yarns, to thereby obtain an electric connector. The step A includes a step A-1 and a step A-2 described later.

Now, the method of manufacturing an electric connector according to this embodiment is described with reference to FIG. 2A to FIG. 2D. FIG. 2A to FIG. 2D perspective views for illustrating an overview of the method of manufacturing an electric connector according to this embodiment. In FIGS. 2A to 2D, the same configurations as those of the electric connector according to this embodiment illustrated in FIGS. 1A to 1C are denoted by the same reference symbols as those therein, and overlapping description of the same configurations is omitted.

Figure 2A:
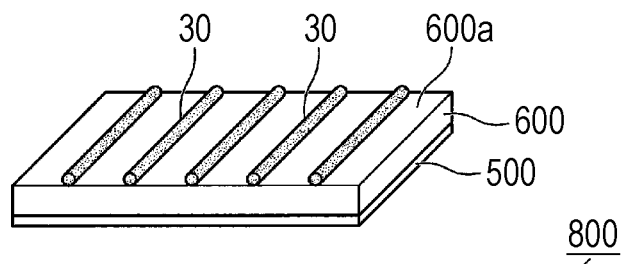
FIGS. 2A to 2D are perspective views for illustrating an overview of a method of manufacturing the electric connector according to the first embodiment.

As illustrated in FIG. 2A, a large number of CNT yarns 30 are arranged on one surface 600a that is a first surface of a first resin layer 600 formed on a base material 500 in parallel to each other at suitable intervals with the CNT yarns 30 being aligned with each other in a longitudinal direction so that the longitudinal direction of each of the CNT yarns 30 is parallel to the one surface 600a of the first resin layer 600 (step A-1).

The longitudinal direction of each of the large number of CNT yarns 30 is arranged so as to be perpendicular to a longitudinal direction of the base material 500.

As the base material 500, a base material, which can be easily peeled from a CNT yarn-containing sheet after the CNT yarn-containing sheet is formed, is used. As a material for the base material 500, there is given, for example, a resin material such as polyethylene terephthalate (PET).

As a material for the first resin layer 600, there is given the same material as that for the elastic body 20.

As a method of forming the first resin layer 600 on the base material 500, there is given, for example, a method involving bonding a sheet-shaped or film-shaped member made of the above-mentioned material to the base material 500 or applying a liquid or paste material made of the above-mentioned material through cross-liking onto the base material 500, and curing the material by heating, humidification, light irradiation, or the like to form a coating film. When the sheet-shaped or film-shaped member is bonded to the base material 500, an adhesive may be used, or a bonding surface of the member may be activated by surface treatment so as to be chemically bound to the base material 500.

The thickness of the first resin layer 600 is not particularly limited, but is preferably from 2 μm to 100 μm.

Figure 2B:
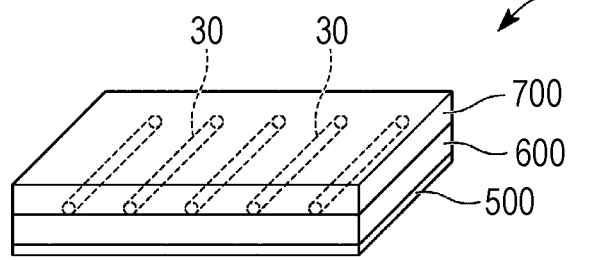

Then, as illustrated in FIG. 2B, a second resin layer 700 is formed on the one surface 600a of the first resin layer 600 on which the large number of CNT yarns 30 are arranged. With this, the second resin layer 700 can be integrated with the first resin layer 600, and the CNT yarns 30 can be fixed between the first resin layer 600 and the second resin layer 700. Through formation of the second resin layer 700, a CNT yarn-containing sheet 800 is obtained (step A-2).

As a material for the second resin layer 700, there is given the same material as that for the first resin layer 600.

As a method of forming the second resin layer 700 on the first resin layer 600, there is given the same method as that of forming the first resin layer 600 on the base material 500.

The thickness of the second resin layer 700 is not particularly limited, but is preferably from 2 μm to 100 μm.

Figure 2C:
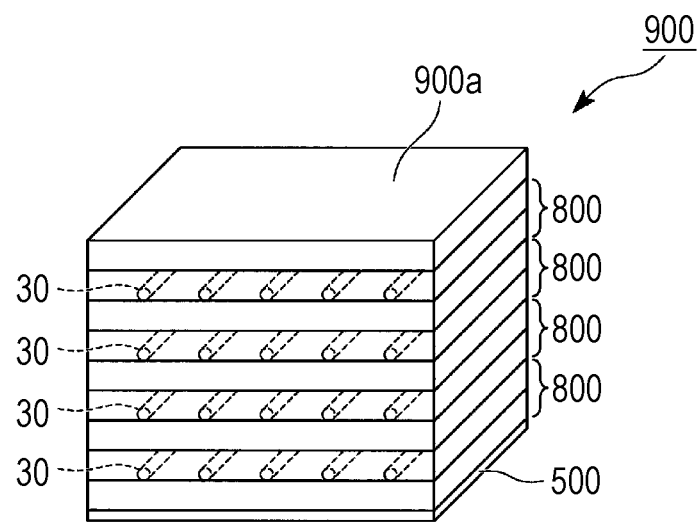

Next, as illustrated in FIG. 2C, a plurality of CNT yarn-containing sheets 800 are laminated with the CNT yarns 30 in each of the CNT yarn-containing sheets being aligned with each other in the longitudinal direction, to thereby form a laminate 900 of the CNT yarn-containing sheets 800 (step B).

In the step B, it is preferred that the plurality of CNT yarn-containing sheets 800 be laminated also with the CNT yarns 30 being aligned in arrangement in addition to the alignment of the CNT yarns 30 in the same direction.

In the step B, aligning the CNT yarns 30 in arrangement means that, when the laminate 900 is viewed from a principal surface 900a thereof, the CNT yarns 30 included in each of the plurality of CNT yarn-containing sheets 800 are overlapped with each other. In FIG. 2C, there is illustrated the case in which all the CNT yarns 30 are overlapped with each other, but a part of the CNT yarns 30 may not be overlapped with each other.

In the step B, when the CNT yarn-containing sheets 800 are laminated in a thickness direction thereof, the base materials 500 are peeled from the CNT yarn-containing sheets 800, respectively, except for the CNT yarn-containing sheet 800 forming a lowermost layer.

In order to laminate the CNT yarn-containing sheets 800, an adhesive may be used, or adhesion surfaces of the CNT yarn-containing sheets 800 may be activated by surface treatment so as to be chemically bound to each other.

When the adhesive is used, it is preferred that the same material as that for the first resin layer 600 be used.

Figure 2D:
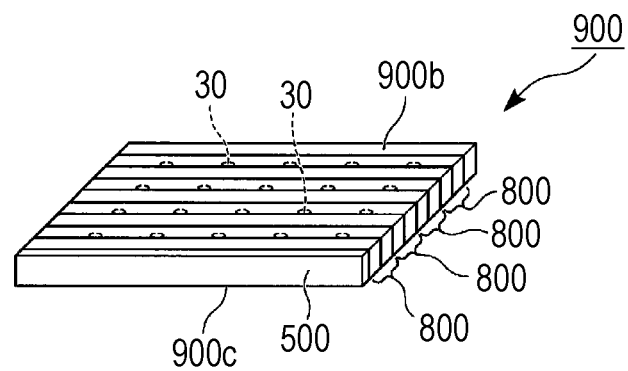

Next, as illustrated in FIG. 2D, the laminate 900 is cut to a suitable thickness in a direction perpendicular to the longitudinal direction (extending direction) of the CNT yarns 30 to obtain the electric connector 10 illustrated in FIGS. 1A to 1C (step C).

In the step C, as a method of cutting the laminate 900, for example, laser processing, mechanical processing such as cutting, or the like is used.

After the steps A to C, the base material 500 is peeled from the laminate 900 to obtain the electric connector 10 illustrated in FIGS. 1A to 1C.

In this embodiment, there is illustrated the case in which the laminate 900 is cut in the direction perpendicular to the extending direction of the CNT yarns 30, but this disclosure is not limited thereto. In the step C, the laminate may be cut in a direction oblique to the extending direction of the CNT yarns.

In the method of manufacturing an electric connector according to this embodiment, the electric connector 10 having a desired thickness is easily obtained by only changing the thickness to be cut from the laminate 900.

The method of manufacturing an electric connector according to this embodiment may include, after the step C of cutting the laminate 900, a step of causing at least a part of each of the CNT yarns 30 to protrude from at least one of one principal surface 900b and another principal surface 900c of the laminate 900.

In the step of causing at least a part of each of the CNT yarns 30 to protrude, as a method of causing at least one of end portions of each of the CNT yarns 30 to protrude from at least one of the one principal surface 900b and the another principal surface 900c of the laminate 900, for example, a method involving cutting a part of each principal surface in at least one of the one principal surface 900b and the another principal surface 900c of the laminate 900 by laser etching, chemical etching, or mechanical processing such as cutting is used. In those methods, the elastic body 20 is removed preferentially as compared to the CNT yarns 30, and one of the end portions of each of the CNT yarns 30 is left under a state of protruding to the surface of the elastic body 20.

Second Embodiment

[Electric Connector]

Figure 3:
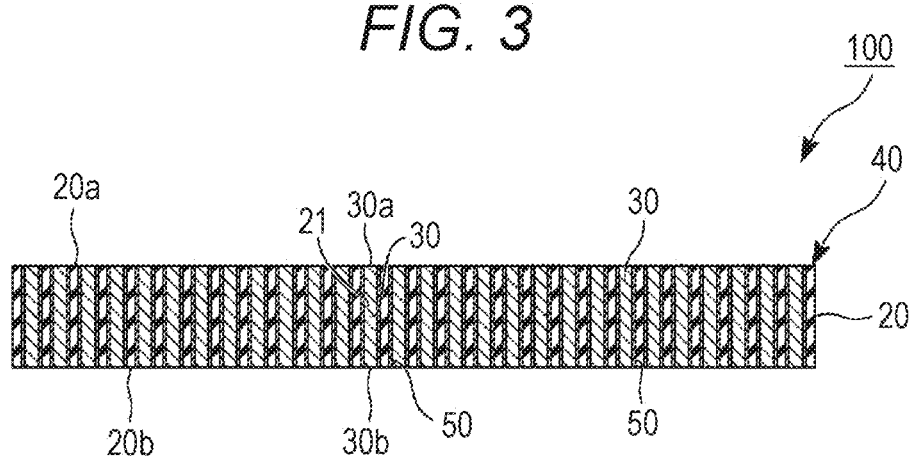
FIG. 3 is a sectional view for illustrating a schematic configuration of an electric connector according to a second embodiment.

FIG. 3 is a sectional view for illustrating a schematic configuration of an electric connector according to this embodiment. In FIG. 3, the same configurations as those of the electric connector according to the first embodiment illustrated in FIGS. 1A to 1C are denoted by the same reference symbols as those therein, and overlapping description of the same configurations is omitted.

As illustrated in FIG. 3, an electric connector 100 according to this embodiment includes a composite 40 including an elastic body 20 and CNT yarns 30.

In the electric connector 100 according to this embodiment, a plated layer 50 is formed on the surface of each of the CNT yarns 30.

There is no particular limitation on a material for the plated layer 50, and there are given, for example, gold, nickel, tin, and copper. The plated layer 50 may be formed of one layer, or two or three layers. It is preferred that the area of each of the CNT yarns 30 covered with the plated layer 50 be from 5% to 100% of the entire surface of the CNT yarn 30.

In the electric connector 100 according to this embodiment, the plated layer 50 is formed on the surface of each of the CNT yarns 30, and hence the resistance on the surface of each of the CNT yarns 30 can be reduced. In addition, when the electric connector 100 is used for connecting devices for a high-frequency current, a high-frequency current is likely to flow through the plated layer 50 formed on the surface of each of the CNT yarns 30.

Also in this embodiment, it is preferred that, under a state of being joined to the through holes 21, at least a part of each of the CNT yarns 30 protrude from at least one of the one principal surface 20a and the another principal surface 20b of the elastic body 20. It is more preferred that at least a part of each of the CNT yarns 30 protrude from both the principal surfaces.

[Method of Manufacturing Electric Connector]

A method of manufacturing an electric connector according to this embodiment is the same as the method of manufacturing an electric connector according to the first embodiment except that the CNT yarns 30 each having the plated layer 50 formed on the surface thereof in advance is used in the step A of the method of manufacturing an electric connector according to the first embodiment.

As a method of forming the plated layer 50 on the surface of each of the CNT yarns 30, for example, electroplating or electroless plating is used. Commercially available CNT yarns each having a plated layer formed thereon may be used.

In the method of manufacturing an electric connector according to this embodiment, the CNT yarns 30 each having the plated layer 50 formed on the surface thereof in advance are used. Therefore, the electric connector 100 suitable for connecting devices for a high-frequency current is obtained.

Third Embodiment

[Electric Connector]

Figure 4:
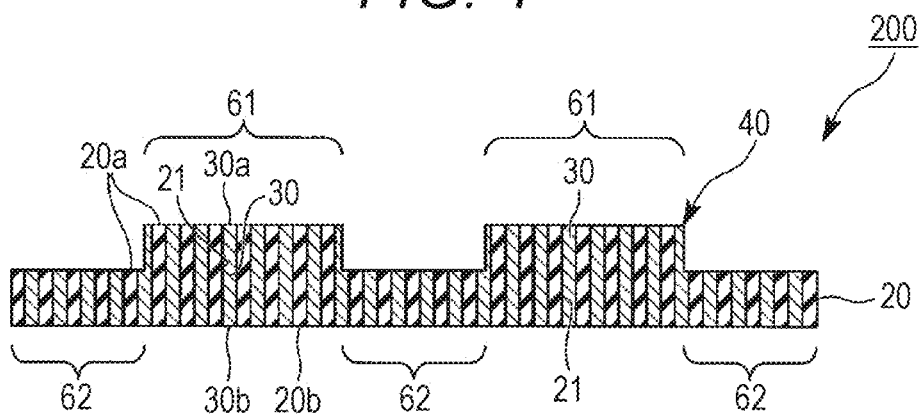
FIG. 4 is a sectional view for illustrating a schematic configuration of an electric connector according to a third embodiment.

FIG. 4 is a sectional view for illustrating a schematic configuration of an electric connector according to this embodiment. In FIG. 4, the same configurations as those of the electric connector according to the first embodiment illustrated in FIGS. 1A to 1C are denoted by the same reference symbols as those therein, and overlapping description of the same configurations is omitted.

As illustrated in FIG. 4, an electric connector 200 according to this embodiment includes a composite 40 including an elastic body 20 and CNT yarns 30.

In the electric connector 200 according to this embodiment, the composite 40 includes protruding portions 61 on the one principal surface 20a side of the elastic body 20. In the protruding portion 61, the elastic body 20 and the CNT yarns 30 partially protrude in the thickness direction of the elastic body 20 (upward in the drawing sheet of FIG. 4). With this, the electric connector 200 according to this embodiment has an uneven surface formed by the protruding portions 61 and regions (hereinafter referred to as "thin layer portions") each having a thickness smaller than that of the protruding portions 61 on the one principal surface 20a side of the elastic body 20.

The arrangement and number of the protruding portions 61 are not particularly limited, and are appropriately adjusted in accordance with the shapes of connection terminals of a device to be connected to the electric connector 200, and the like. More specifically, when the surface of the device, on which the connection terminals are provided, has unevenness, and the connection terminals are depressed, the arrangement and number of the protruding portions 61 are appropriately adjusted so as to correspond to the connection terminals. As one example, the total area of the protruding portions 61 with respect to the total area of the principal surface of the electric connector 200, which is formed of a total of the one principal surface 20a or the another principal surface 20b including the protruding portions 61 of the elastic body 20 and cross sections of the through holes 21 in plan view, can be set to from 5% to 95%.

The area is measured based on an image obtained by observing the one principal surface of the electric connector 200 with magnifying observation means such as a digital microscope.

As a cross-sectional shape of the protruding portion 61 obtained when the electric connector 200 is cut in the thickness direction, there are given, for example, a rectangular shape, a trapezoidal shape, a parallelogram, and shapes obtained by cutting off corners of those polygonal shapes.

It is preferred that the height of each of the protruding portions 61 be, for example, from 2 μm to 60 μm, more preferably from 10 μm to 30 μm. When the height falls within those ranges, the stability of connection with respect to depressed electrodes of an electronic device can be enhanced. The heights of the plurality of protruding portions 61 formed on the electric connector 200 may be the same or different. The height of each of the protruding portions 61 is measured based on an image obtained by observing across section of the electric connector 200 taken along the thickness direction thereof with magnifying observation means such as a digital microscope.

In the electric connector 200 according to this embodiment, the composite 40 includes the protruding portions 61 that protrude in the thickness direction of the elastic body 20 on the one principal surface 20a side of the elastic body 20. Therefore, even when the connection terminals of the device to be connected to the electric connector 200 are depressed, the electric connection state between the CNT yarns 30 and the connection terminals of the device can be stably kept by bringing the protruding portions 61 into contact with the depressed connection terminals.

In this embodiment, there is illustrated the case in which the composite 40 includes the protruding portions 61 that protrude in the thickness direction of the elastic body 20 on the one principal surface 20a side of the elastic body 20. However, the composite 40 may include the protruding portions 61 that protrude in the thickness direction of the elastic body 20 on sides of both the principal surfaces. The heights of the protruding portions 61 provided on the respective principal surfaces may be the same or different.

Also in this embodiment, it is preferred that, under a state of being joined to the through holes 21, at least a part of each of the CNT yarns 30 protrude from at least one of the one principal surface 20a and the another principal surface 20b of the elastic body 20. It is more preferred that at least a part of each of the CNT yarns 30 protrude from both the principal surfaces.

Also in this embodiment, a plated layer may be formed on the surface of each of the CNT yarns 30.

[Method of Manufacturing Electric Connector]

A method of manufacturing an electric connector according to this embodiment includes steps A to C of the method of manufacturing an electric connector according to the first embodiment and a step (hereinafter referred to as "step D") of removing a part of the composite including the elastic body and the CNT yarns in the thickness direction from at least one surface of the first surface and the second surface of the electric connector obtained in the step C, to thereby form protruding portions in which the elastic body and the CNT yarns partially protrude in the thickness direction of the electric connector.

In this case, the first surface and the second surface of the sheet-shaped electric connector are principal surfaces opposed to each other.

Figure 5A:
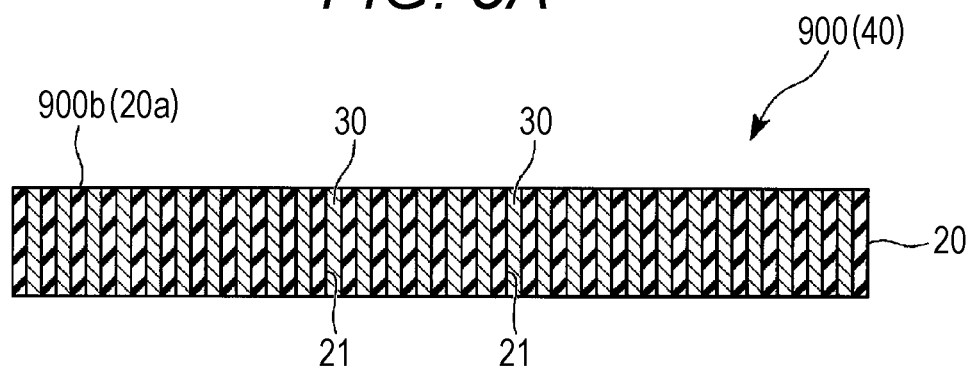
FIGS. 5A and 5B are sectional views for illustrating an overview of a method of manufacturing the electric connector according to the third embodiment.
Figure 5B:
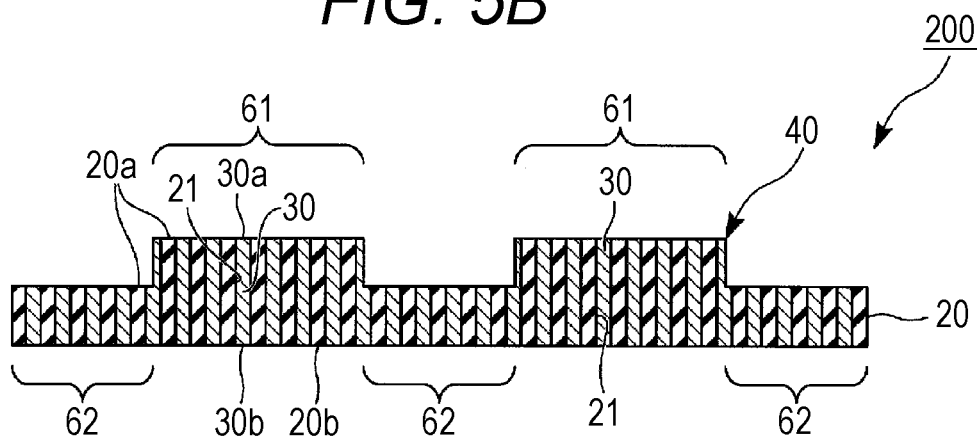

Now, the method of manufacturing an electric connector according to this embodiment is described with reference to FIG. 5A and FIG. 5B. FIG. 5A and FIG. 5B are sectional views for illustrating an overview of the method of manufacturing an electric connector according to this embodiment. In FIGS. 5A and 5B, the same configurations as those of the method of manufacturing an electric connector according to the first embodiment illustrated in FIGS. 2A to 2D are denoted by the same reference symbols as those therein, and overlapping description of the same configurations is omitted.

In the method of manufacturing an electric connector according to this embodiment, as illustrated in FIG. 5A, the laminate 900 (corresponding to the composite 40 forming the electric connector 10 illustrated in FIGS. 1A to 1C) cut to a suitable thickness is obtained through the steps A to C of the method of manufacturing an electric connector according to the above-mentioned first embodiment.

Then, as illustrated in FIG. 5B, a part of the laminate 900 (composite 40) including the elastic body 20 and the CNT yarns 30 is removed in the thickness direction from the one principal surface 900a side of the laminate 900 (one principal surface 20a side of the elastic body 20), to thereby form the protruding portions 61, in which the elastic body 20 and the CNT yarns 30 partially protrude in the thickness direction of the elastic body 20, on the laminate 900 (composite 40) (step D).

In the step D, as a method of cutting the laminate 900 (composite 40), for example, laser etching, mechanical processing such as cutting, or the like is used.

Through the steps A to D, the electric connector 200 illustrated in FIG. 4 is obtained.

In the method of manufacturing an electric connector according to this embodiment, it is possible to manufacture the electric connector 200 capable of stably keeping the electrical connection state between the CNT yarns 30 and the connection terminals of the device to be connected to the electric connector 200 even when the connection terminals of the device are depressed.

In this embodiment, there is illustrated the case in which the protruding portions 61 that protrude in the thickness direction of the elastic body 20 are formed on the composite 40 on the one principal surface 20a side of the elastic body 20 in the step D. However, the protruding portions 61 that protrude in the thickness direction of the elastic body 20 may be formed on sides of both the principal surfaces.

The method of manufacturing an electrical connector according to this embodiment may include, after the step D, a step of causing the one end portion 30a and the another end portion 30b of each of the CNT yarns 30 to protrude from the one principal surface 20a and the another principal surface 20b of the elastic body 20.

Fourth Embodiment

[Electrical Connector]

Figure 6:
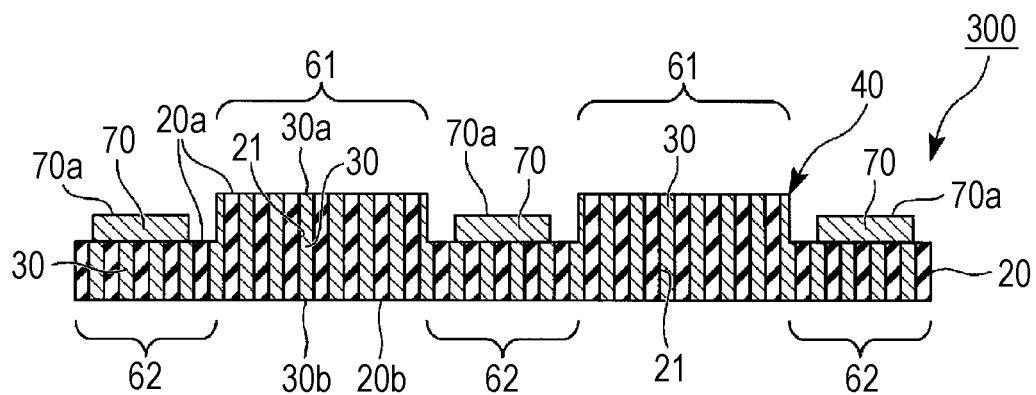
FIG. 6 is a sectional view for illustrating a schematic configuration of an electric connector according to a fourth embodiment.

FIG. 6 is a sectional view for illustrating a schematic configuration of an electrical connector according to this embodiment. In FIG. 6, the same configurations as those of the electrical connectors according to the first embodiment illustrated in FIGS. 1A to 1C and the third embodiment illustrated in FIG. 4 are denoted by the same reference symbols as those therein, and overlapping description of the same configurations is omitted.

As illustrated in FIG. 6, an electrical connector 300 according to this embodiment includes a composite 40 including an elastic body 20 and CNT yarns 30.

In the electrical connector 300 according to this embodiment, the composite 40 includes the protruding portions 61 that protrude in the thickness direction of the elastic body 20 (upward in the drawing sheet of FIG. 6) and thin layer portions 62 each having a thickness smaller than that of the protruding portions 61 on the one principal surface 20a side of the elastic body 20, and a sheet-shaped member 70 made of a resin is laminated on each of the thin layer portions 62.

As one example, the total area of the sheet-shaped members 70 with respect to the total area of the principal surface of the electrical connector 300, which is formed of a total of areas of the exposed one principal surface 20a or another principal surface 20b of the elastic body 20 and the sheet-shaped members 70, and cross sections of the through holes 21 in plan view, can be set to from 10% to 90%.

The area is measured based on an image obtained by observing the one principal surface or the another principal surface with magnifying observation means such as a digital microscope.

It is preferred that, in the thin layer portion 62, an outermost surface (end surface) of the one end portion 30a of each of the CNT yarns 30 be at least in flush with a surface (upper surface) 70a of the sheet-shaped member 70 and protrude from the surface (upper surface) 70a of the sheet-shaped member 70.

The thickness of the sheet-shaped member 70 is not particularly limited, and is appropriately adjusted in accordance with elasticity required in the composite 40. It is preferred that the thickness of the sheet-shaped member 70 be from 0.01 mm to 0.5 mm.

It is preferred that a material of the sheet-like member 70 be one having heat resistance and dimensional stability when formed into the sheet-like member 70. Examples of such material include polyimide (PI), an epoxy resin, polyethylene terephthalate (PET), polybutylene terephthalate (PBT), polyvinyl chloride, polystyrene, polyacrylonitrile, polyethylene, polypropylene, acryl, polybutadiene, polyphenylene ether (PPE), polyphenylene sulfide (PPS), polyether ether ketone (PEEK), a liquid crystal polymer (LCP), polyamideimide (PAI), polyetherimide (PEI), polyethersulfone (PES), and polycarbonate (PC). Of those, PI, PPS, PEEK, and LCP are preferred from the viewpoint of excellent heat resistance and dimension stability.

The sheet-shaped member 70 may be non-woven fabric made of those resins. It is preferred that the sheet-shaped member 70 be non-woven fabric because a heat radiation property is enhanced.

In the electrical connector 300 according to this embodiment, the sheet-shaped member 70 made of a resin is laminated on each of the thin layer portions 62. Therefore, the laminate including the composite 40 and the sheet-shaped members 70 is excellent in heat resistance and dimension stability as compared to the case of the composite 40 alone, and thus the electrical connection state between the CNT yarns 30 and the connection terminals of the device to be connected to the electric connector 200 can be stably kept.

In this embodiment, there is illustrated the case in which the composite 40 includes the protruding portions 61 that protrude in the thickness direction of the elastic body 20 and the thin layer portions 62 on the one principal surface 20a side of the elastic body 20, and the sheet-shaped members 70 made of a resin are laminated on the thin layer portions 62. However, the composite 40 may include the protruding portions 61 that protrude in the thickness direction of the elastic body 20 and the thin layer portions 62 on sides of both the principal surfaces, and the sheet-shaped members 70 made of a resin may be laminated on the thin layer portions 62 on both sides. In addition, the sheet-shaped members 70 made of a resin may be laminated also on the protruding portions 61.

Also in this embodiment, it is preferred that, under a state of being joined to the through holes 21, at least a part of each of the CNT yarns 30 protrude from at least one of the one principal surface 20a and the another principal surface 20b of the elastic body 20. It is more preferred that at least a part of each of the CNT yarns 30 protrude from both the principal surfaces. In addition, it is preferred that at least one end portion of each of the CNT yarns 30 protrude from the sheet-shaped member 70 formed on each of the principal surfaces.

Also in this embodiment, a plated layer may be formed on the surface of each of the CNT yarns 30.

[Method of Manufacturing Electric Connector]

A method of manufacturing an electric connector according to this embodiment includes the steps A to C of the method of manufacturing an electric connector according to the first embodiment, the step (step D) of forming the above-mentioned protruding portions, and a step (hereinafter referred to as "step E") of laminating, after the step D of forming the protruding portions, sheet-shaped members made of a resin on the regions obtained by removing a part of the composite, that is, the regions (thin layer portions) other than the protruding portions on the one principal surface side of the elastic body.

Figure 7A:
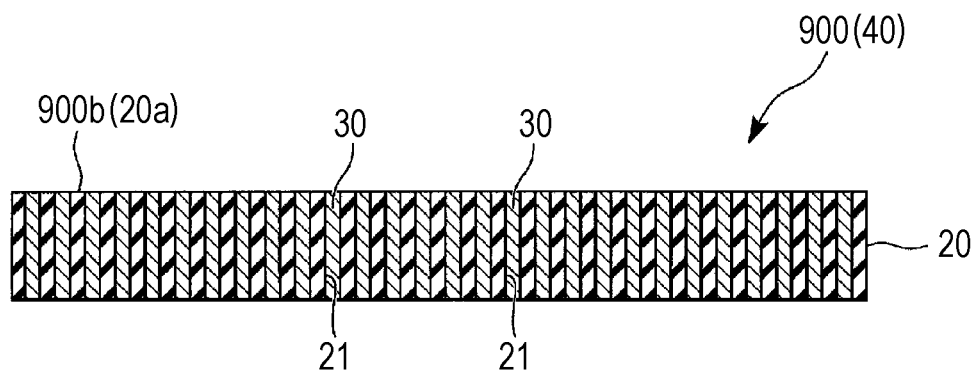
FIGS. 7A to 7C are sectional views for illustrating an overview of a method of manufacturing the electric connector according to the fourth embodiment.
Figure 7B:
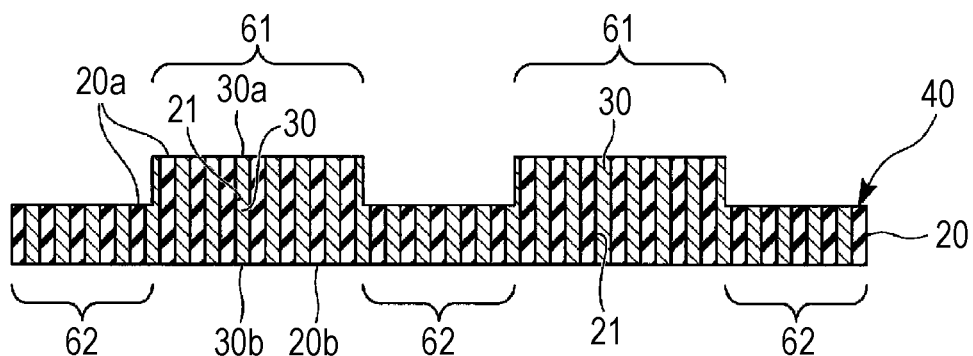
Figure 7C:
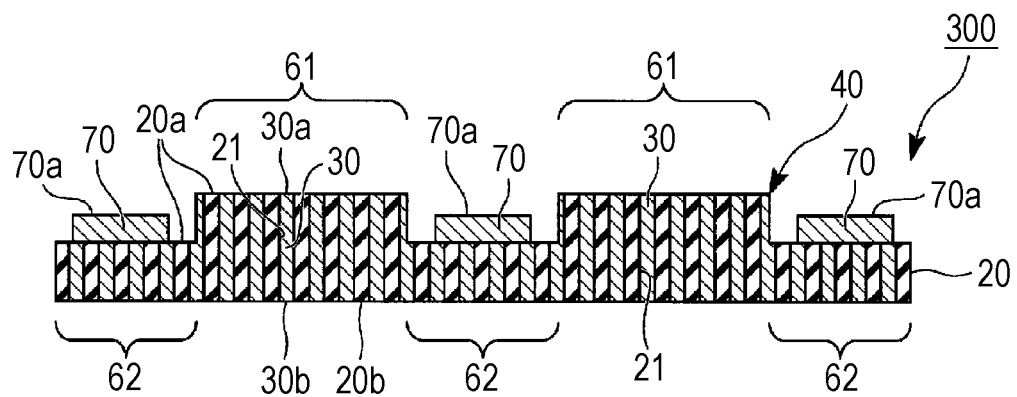

Now, the method of manufacturing an electric connector according to this embodiment is described with reference to FIG. 7A to FIG. 7C. FIG. 7A to FIG. 7C sectional views for illustrating an overview of the method of manufacturing an electric connector according to this embodiment. In FIGS. 7A to 7C, the same configurations as those of the method of manufacturing an electric connector according to the first embodiment illustrated in FIGS. 2A to 2D and the method of manufacturing an electric connector according to the third embodiment illustrated in FIGS. 5A and 5B are denoted by the same reference symbols as those therein, and overlapping description of the same configurations is omitted.

In the method of manufacturing an electric connector according to this embodiment, as illustrated in FIG. 7A, the laminate 900 (corresponding to the composite 40 forming the electric connector 10 illustrated in FIGS. 1A to 1C) cut to a suitable thickness is obtained through the steps A to C of the method of manufacturing an electric connector according to the first embodiment.

Then, as illustrated in FIG. 7B, a part of the laminate 900 (composite 40) including the elastic body 20 and the CNT yarns 30 is removed in the thickness direction from the one principal surface 900b side of the laminate 900 (one principal surface 20a side of the elastic body 20), to thereby form the protruding portions 61, in which the elastic body 20 and the CNT yarns 30 partially protrude in the thickness direction of the elastic body 20, on the laminate 900 (composite 40) (step D).

Then, as illustrated in FIG. 7C, the sheet-shaped members 70 made of a resin are laminated on the regions obtained by removing a part of the laminate 900 (composite 40), that is, the thin layer portions 62 each having a thickness smaller than that of the protruding portions 61 on the one principal surface 20a side of the elastic body 20 (step E).

In the step E, as a method of laminating the sheet-shaped members 70 on the thin layer portions 62, for example, a method involving bonding the sheet-shaped members 70 to the thin layer portions 62 with an adhesive, a method involving bonding the sheet-shaped members 70 to the thin layer portions 62 by surface treatment through irradiation of an excimer, or the like is used.

In the step E, as a positioning method at a time of bonding the sheet-shaped members 70 to the thin layer portions 62, there are given, for example, a method involving showing marks for positioning (marking) in portions in which the CNT yarns 30 are not arranged in the laminate 900 and in the vicinity of the end portions of the sheet-shaped members 70 and performing positioning through image recognition, and a method involving forming convex portions and concave portions for positioning on the laminate 900, followed by fitting.

Through the steps A to E, the electric connector 300 illustrated in FIG. 6 is obtained.

In the method of manufacturing an electric connector according to this embodiment, the sheet-shaped members 70 made of a material excellent in heat radiation property, which is different from that for the elastic body 20, can be selected to be bonded to the thin layer portions 62 of the elastic body 20.

In this embodiment, there is illustrated the case in which the protruding portions 61 that protrude in the thickness direction of the elastic body 20 are formed on the composite 40 on the one principal surface 20a side of the elastic body 20 in the step D. However, the protruding portions 61 that protrude in the thickness direction of the elastic body 20 may be formed on sides of both the principal surfaces.

In this embodiment, there is illustrated the case in which the sheet-shaped members 70 made of a resin are laminated on the thin layer portions 62 on the one principal surface 20a side of the elastic body 20. However, the sheet-shaped members 70 made of a resin may be laminated on the thin layer portions 62 on sides of both the principal surfaces.

The method of manufacturing an electric connector according to this embodiment may also include, after the step D or E, a step of causing at least one of the one end portion 30a and the another end portion 30b of each of the CNT yarns 30 to protrude from at least one of the one principal surface 20a and the another principal surface 20b of the elastic body 20. In addition, the method of manufacturing an electric connector according to this embodiment may also include a step of causing at least one of both the end portions of each of the CNT yarns 30 to protrude from the sheet-shaped members 70 on each of the principal surfaces. A method of causing the end portion of each of the CNT yarns 30 to protrude from the sheet-shaped member 70 may be the same as the method of causing the end portion of each of the CNT yarns 30 to protrude from the principal surface.

EXAMPLE

Example 1

A first resin layer and a second resin layer, which were each made of a silicone rubber and had a thickness of 0.04 mm, were formed on a PET sheet through calendar molding. Ten CNT yarns (diameter: 40 μm, tensile strength: 300 N/mm$^2$, electric resistivity: $1.7 \times 10^{-3}$ Ω·cm) were arranged in parallel to each other at intervals of 0.1 mm on the first resin layer so as to be aligned with each other in a longitudinal direction. The second resin layer was bonded to the first resin layer so that the silicone rubber was brought into contact with the arranged CNT yarns while the above-mentioned arrangement was prevented from being collapsed, to obtain a CNT yarn-containing sheet having a thickness of 0.08 mm. The silicone rubber used in this case had a rubber hardness of 30 when the rubber hardness was measured with a type A durometer in accordance with JIS K 6253-3:2012.

Nine CNT yarn-containing sheets were prepared. The PET sheets other than the PET sheet of a lowermost layer were removed, to thereby obtain a laminate in which the nine CNT yarn-containing sheets were laminated with the CNT yarns being aligned in the longitudinal direction so that the CNT yarns were overlapped with each other in a lamination direction. In this case, the CNT yarn-containing sheets in the laminate were caused to adhere to each other through an adhesive layer (thickness: 0.02 mm) made of a silicone rubber.

A blade was inserted into the laminate perpendicularly to the longitudinal direction of each of the CNT yarns included in the laminate, to obtain an electric connector having a thickness of 0.5 mm as illustrated in FIGS. 1A to 1C.

A pitch P1 and a pitch P2 of the manufactured electrical connector illustrated in FIGS. 1A to 1C were 0.1 mm and 0.1 mm, respectively.

Example 2

An electric connector as illustrated FIGS. 1A to 1C was obtained in the same manner as in Example 1 except that (a) CNT yarns (diameter: 15 μm±2 μm, tensile strength: 620 N/mm$^2$, electric resistivity: $1.1 \times 10^{-5}$ Ω·cm) each having a plated layer of copper on a surface were used, (b) the pitch P1 was 0.2 mm, and the pitch P2 was 0.1 mm, and (c) the electric connector had a thickness of 0.3 mm.

Comparative Example 1

An electric connector as illustrated in FIGS. 1A to 1C was obtained in the same manner as in Example 1 except that (a)

conductive wires made of brass (diameter: 40 µm, tensile strength: 790 N/mm$^2$, electric resistivity: 7.0×10$^{-6}$ Ω·cm) each including a plated layer of gold and a plated layer of nickel in the stated order from a surface were used, and (b) a silicone rubber having the above-mentioned rubber hardness of 50 was used.

Comparative Example 2

An electric connector as illustrated in FIGS. 1A to 1C was obtained in the same manner as in Comparative Example 1 except that (a) a silicone rubber having the above-mentioned rubber hardness of 30 was used, and (b) at the time of cutting the electric connector out from the laminate, a blade was inserted into the laminate at an angle of 27° with respect to a direction orthogonal to a longitudinal direction of the conductive wires made of brass, to thereby obtain the electric connector in which an angle formed by the conductive wires made of brass with respect to the normal to the principal surface was 27°.

<Evaluation Method 1>

A copper foil tape formed of a copper layer having a thickness of 35 µm and a conductive pressure-sensitive adhesive having a thickness of 25 µm was bonded to the surface of a glass substrate, and each of the electric connectors of Examples and Comparative Examples was placed on the copper layer so that the first surface of the electric connector was brought into contact with the copper layer. Distal end portions each having a diameter of 1 mm of cylindrical conductive terminals were pushed into the distal ends of the CNT yarns exposed to the second surface on an opposite side of the first surface, and then the surface of the copper layer was observed.

<Evaluation Method 2>

Each of the electric connectors of Examples and Comparative Examples was arranged between a probe plated with gold having a diameter of 1.0 mm and a substrate having connection terminals plated with gold to form a test apparatus.

In addition, in order to measure a resistance value between the probe and the substrate, a resistance meter (product name: RM3545-01, manufactured by Hioki E.E. Corporation) was connected to the probe and the substrate.

In this state, while the electric connector was compressed in a thickness direction thereof under a condition of a movement speed of 0.05 mm/min, the resistance value between the probe and the substrate was measured, to thereby investigate a relationship between the displacement amount of the electric connector (amount of the electric connector compressed in the thickness direction) and the resistance value between the probe and the substrate.

In addition, at the time of compressing the electric connector, a load applied to the electric connector was measured by an automatic load tester (product name: MAX-1KN-S-1, manufactured by Japan Instrumentation System, Co., Ltd.), to thereby investigate a relationship between the displacement amount of the electric connector and the load.

In this connection state, a load required for a displacement amount of sinking of the second surface caused by pushing, and an electric resistance value in the above-mentioned conduction, were measured.

<Result 1>

Figure 8:
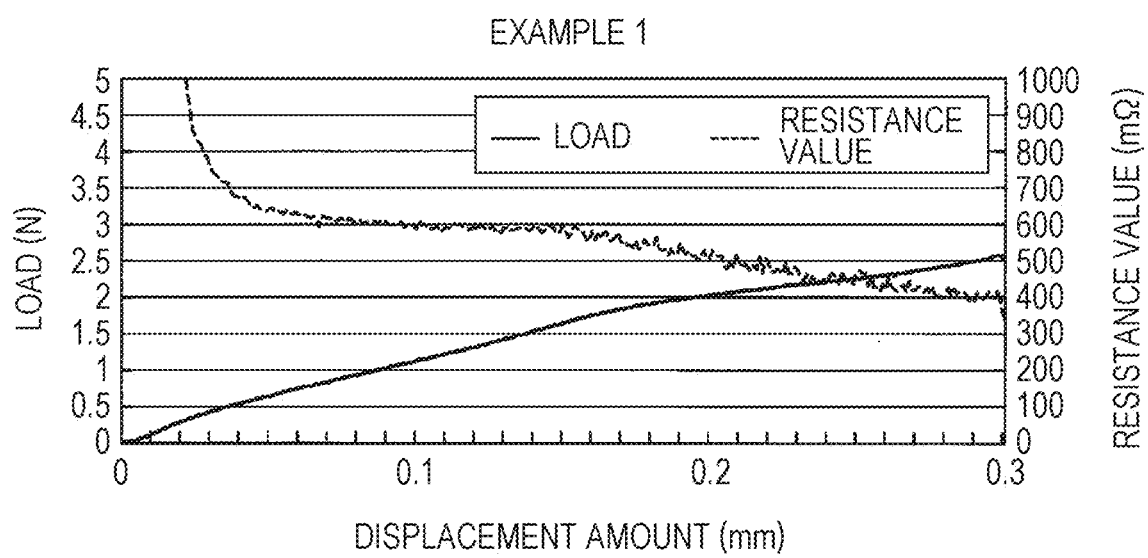
FIG. 8 is a graph for showing results obtained when a probe is connected to an electric connector of Example 1.
Figure 9:
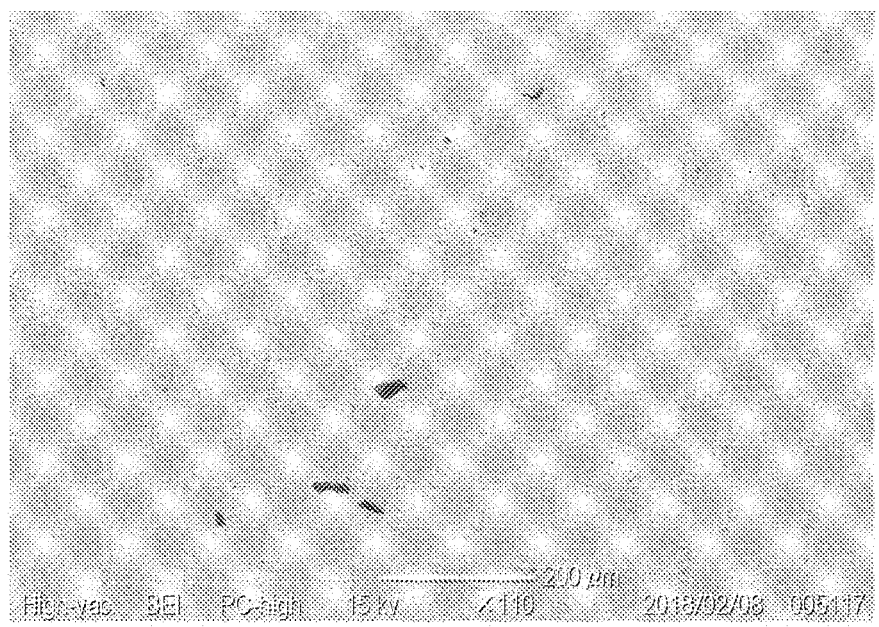
FIG. 9 is an electron microscope image of a surface of copper foil in which the electric connector of Example 1 is pushed.

In a result of Example 1, as shown in a graph of FIG. 8, the electric resistance value was stable, and the connection was stable in a section of a displacement amount of from 0.04 mm to 0.3 mm. In addition, when the electric connector was removed after the test, and the surface of the copper layer was observed with an electron microscope, there were no flaws caused by sticking of the CNT yarns (FIG. 9).

The load at a time of pushing was 2.5 N at maximum, and hence it was confirmed that an excessive force was not applied to the copper layer from the CNT yarns of the electric connector.

<Result 2>

Figure 10:
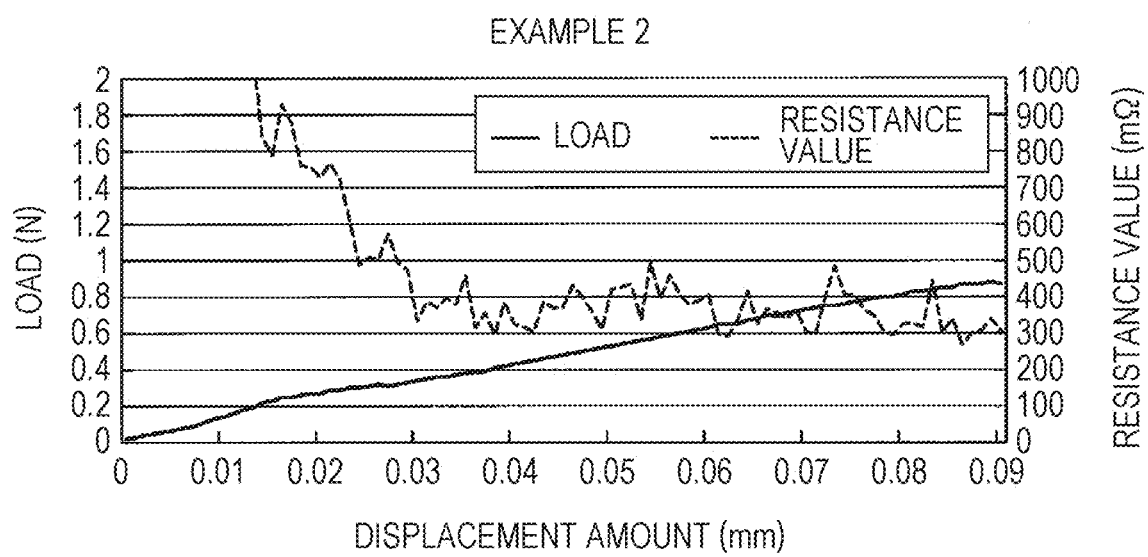
FIG. 10 is a graph for showing results obtained when a probe is connected to an electric connector of Example 2.
Figure 11:
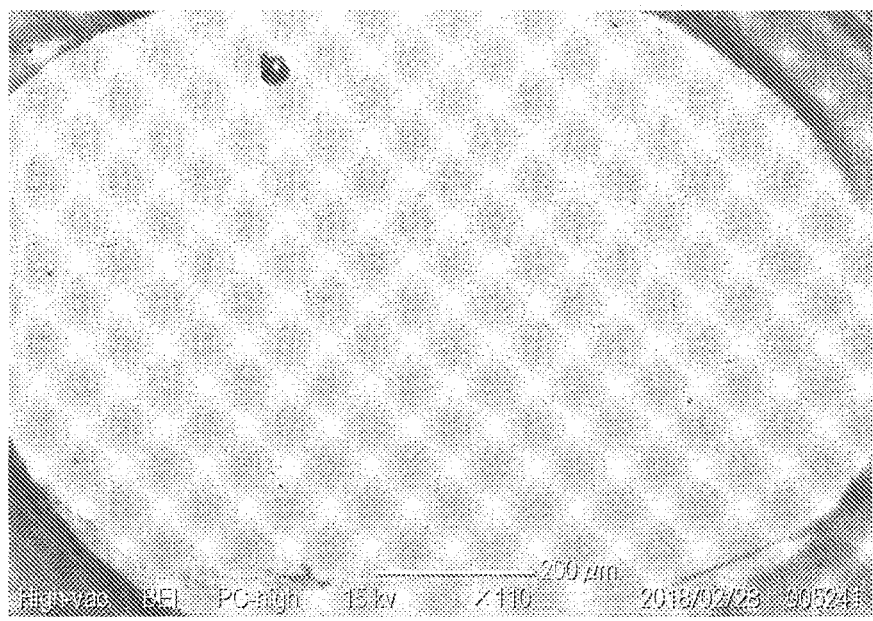
FIG. 11 is an electron microscope image of a surface of copper foil in which the electric connector of Example 2 is pushed.

In a result of Example 2, as shown in a graph of FIG. 10, the electric resistance value remained on the same level, and the connection was roughly stable in a section of a displacement amount of from 0.03 mm to 0.09 mm. In addition, when the electric connector was removed after the test, and the surface of the copper layer was observed with an electron microscope, there were no flaws caused by sticking of the CNT yarns (FIG. 11). The load at a time of pushing was 0.85 N at maximum, and hence it was confirmed that an excessive force was not applied to the copper layer from the CNT yarns of the electric connector.

<Result 3>

Figure 12:
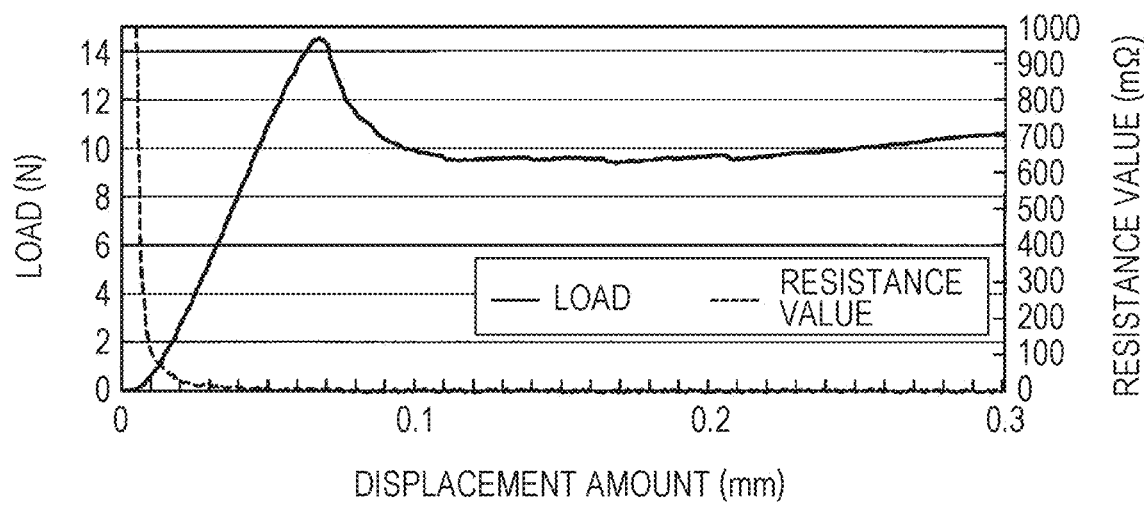
FIG. 12 is a graph for showing results obtained when a probe is connected to an electric connector of Comparative Example 1.
Figure 13:
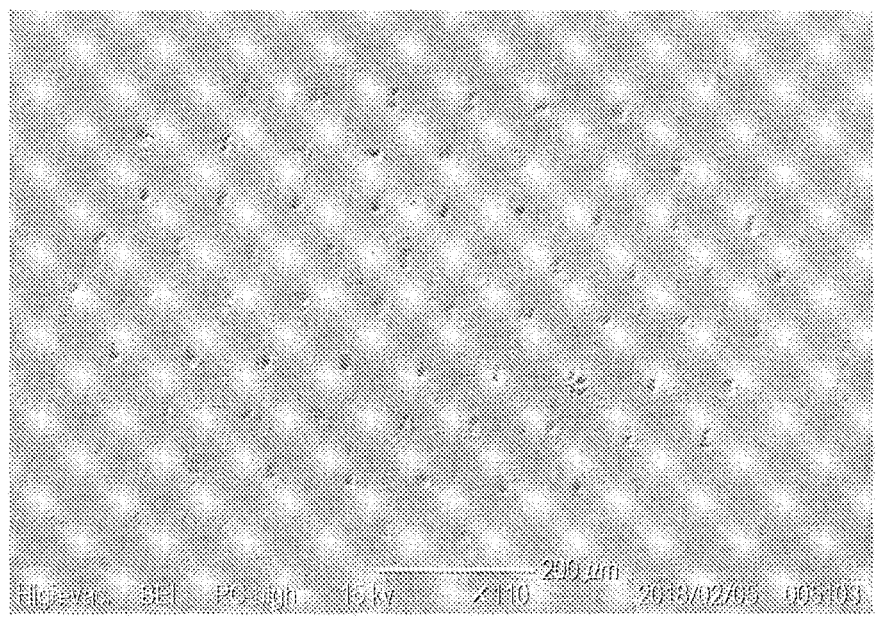
FIG. 13 is an electron microscope image of a surface of copper foil in which the electric connector of Comparative Example 1 is pushed.

In a result of Comparative Example 1, as shown in a graph of FIG. 12, the electric resistance value was stable, and the connection was stable in a section of a displacement amount of from 0.02 mm to 0.3 mm. However, when the electric connector was removed after the test, and the surface of the copper layer was observed with an electron microscope, it was clearly confirmed that deep flaws caused by sticking of the metal conductive wires were formed in an array of 10 (vertical direction)×10 (horizontal direction) (FIG. 13). The load at a time of pushing was 14.5 N at maximum, and hence it was confirmed that an excessive force was applied to the copper layer from the metal conductive wires of the electric connector to form irreversible flaws.

<Result 4>

Figure 14:
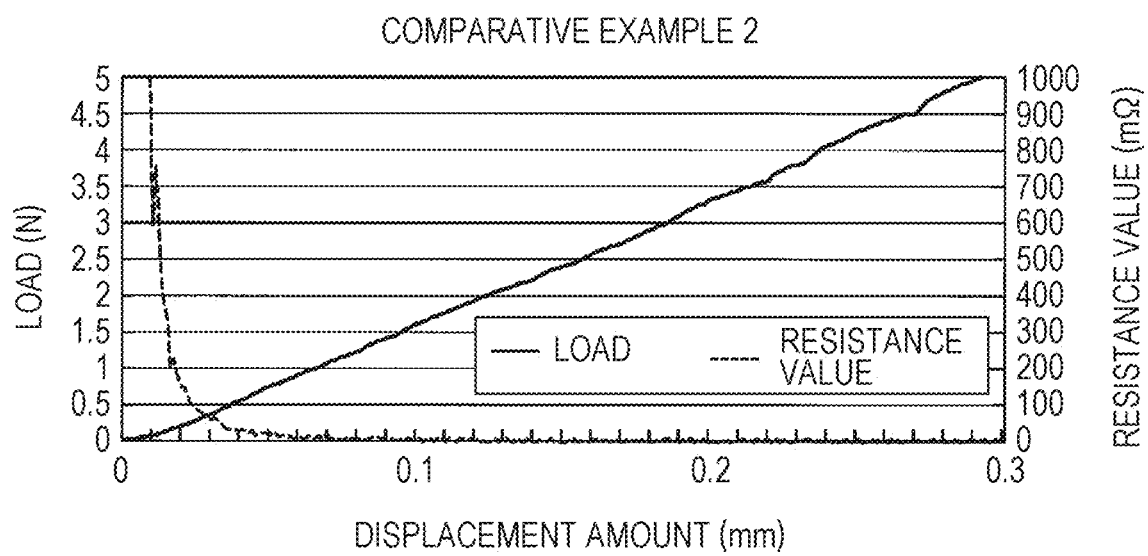
FIG. 14 is a graph for showing results obtained when a probe is connected to an electric connector of Comparative Example 2.
Figure 15:
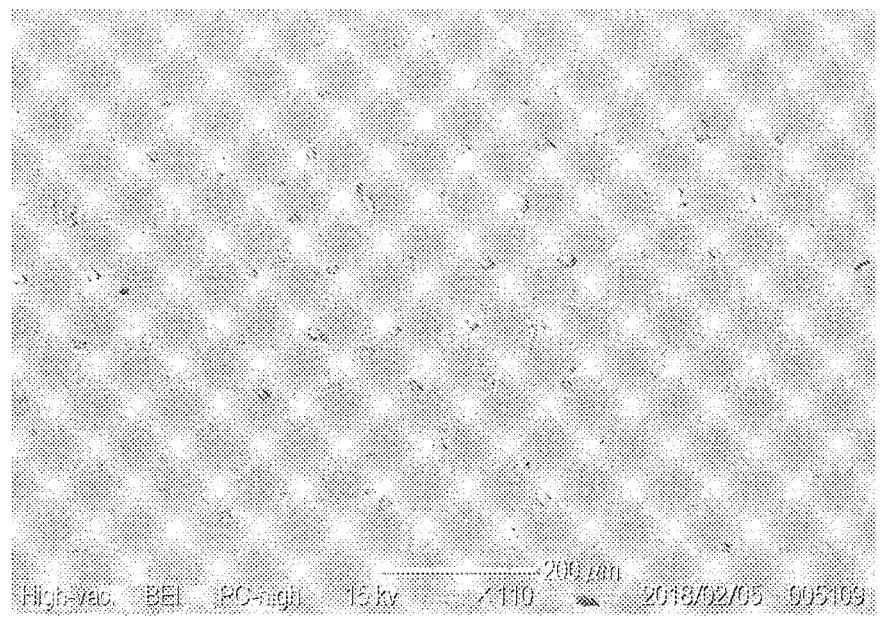
FIG. 15 is an electron microscope image of a surface of copper foil in which the electric connector of Comparative Example 2 is pushed.

In a result of Comparative Example 2, as shown in a graph of FIG. 14, the electric resistance value was stable, and the connection was stable in a section of a displacement amount of from 0.04 mm to 0.3 mm. However, when the electric connector was removed after the test, and the surface of the copper layer was observed with an electron microscope, it was clearly confirmed that relatively shallow flaws caused by sticking of the metal conductive wires were formed in an array of 10 (vertical direction)×9 (horizontal direction) (FIG. 15). The load at a time of pushing was 5 N at maximum, and hence it was confirmed that an excessive force was applied to the copper layer from the metal conductive wires of the electric connector to form irreversible flaws.

It is clear from the above-mentioned results that the electric connectors of Examples 1 to 2 can be sufficiently pushed in at a time of electrical connection, and there is no risk in that the electric connector damage electrodes of an electronic device to be connected to the electric connector. It should be noted that the electrodes were not damaged in Example 1 in which the load of 2.5 N was applied. It is clear that the CNT yarns are less liable to damage the electrodes.

Meanwhile, in the electric connector of Comparative Example 1, a high load is applied in an initial stage (displacement amount of less than 0.1 mm) of pushing, and with this, the electrodes are damaged. Thus, it is difficult to avoid damage to the electrodes. In the electric connector of Comparative Example 2, a load is increased in proportion to a displacement amount of pushing, and there is a risk in that a larger load of more than 5 N may be applied. It is difficult to adjust the degree of pushing of the electrodes with respect to the electric connector in increments of 0.1 mm through a manual operation, and there is a high risk in that the electrodes may be damaged.

INDUSTRIAL APPLICABILITY

The electric connector of this disclosure is capable of stably connecting electronic devices to each other without damage to connection terminals of the electronic devices at the time of connecting the electronic devices to each other.

The invention claimed is:

1. An electric connector, which is to be arranged between a connection terminal of a first device and a connection terminal of a second device, and is configured to electrically connect the connection terminal of the first device and the connection terminal of the second device to each other, the electric connector comprising:
   an elastic body having a plurality of through holes each being opened on a first surface and a second surface; and
   one or more carbon nanotube yarns joined to each of the through holes,
      wherein a protruding portion, in which the elastic body and the carbon nanotube yarns are configured to partially protrude in a thickness direction of the elastic body, on at least one of the first surface and the second surface of the elastic body, wherein a sheet-shaped member made of a resin, which is laminated on a region having a thickness smaller than a thickness of the protruding portion, on at least one of the first surface and the second surface of the elastic body.

2. The electric connector according to claim 1, wherein each of the through holes are configured to penetrate through the elastic body obliquely to the thickness direction of the elastic body.

3. The electric connector according to claim 1, wherein at least a part of each of the carbon nanotube yarns is configured to protrude from at least one of the first surface and the second surface of the elastic body.

4. The electric connector according to claim 1, further comprising a plated layer on a surface of each of the carbon nanotube yarns.

5. A method of manufacturing an electric connector, comprising:

arranging a plurality of carbon nanotube yarns on a first surface of a first resin layer formed of an elastic body at suitable intervals with the plurality of carbon nanotube yarns being aligned with each other in a longitudinal direction;

forming a second resin layer formed of an elastic body on the first surface of the first resin layer, to thereby form a carbon nanotube yarn-containing sheet;

laminating a plurality of carbon nanotube yarn-containing sheets on one another with the plurality of carbon nanotube yarns in each of the plurality of carbon nanotube yarn-containing sheets being aligned with each other in the longitudinal direction, to thereby form a laminate of the plurality of carbon nanotube yarn-containing sheets; and cutting the laminate in a perpendicular direction or an oblique direction with respect to the longitudinal direction of the plurality of carbon nanotube yarns, to thereby obtain an electric connector, removing a part of the elastic body and a part of the plurality of carbon nanotube yarns in a thickness direction from at least one of a first surface and a second surface of the electric connector, to thereby form a protruding portion in which the elastic body and the plurality of carbon nanotube yarns partially protrude in the thickness direction of the electric connector, and laminating a sheet-shaped member made of a resin on a region other than the protruding portion after forming the protruding portion, wherein the protruding portion, in which the elastic body and the carbon nanotube yarns are configured to partially protrude in the thickness direction of the elastic body, on at least one of the first surface and the second surface of the elastic body.

6. The method of manufacturing an electric connector according to claim 5, further comprising causing at least a part of each of the plurality of carbon nanotube yarns in the electric connector to protrude from at least one of the first surface and the second surface of the electric connector.

* * * * *